US006744311B2

United States Patent
Kirn

(10) Patent No.: US 6,744,311 B2
(45) Date of Patent: Jun. 1, 2004

(54) SWITCHING AMPLIFIER WITH VOLTAGE-MULTIPLYING OUTPUT STAGE

(75) Inventor: Larry Kirn, East Lansing, MI (US)

(73) Assignee: JAM Technologies, LLC, Boston, MA (US)

( * ) Notice: Subject to any disclaimer, the term of this patent is extended or adjusted under 35 U.S.C. 154(b) by 0 days.

(21) Appl. No.: 10/128,049

(22) Filed: Apr. 23, 2002

(65) Prior Publication Data

US 2002/0180519 A1 Dec. 5, 2002

Related U.S. Application Data

(60) Provisional application No. 60/285,755, filed on Apr. 23, 2001.

(51) Int. Cl.[7] .................................................. H03F 3/38
(52) U.S. Cl. ....................... 330/10; 330/207 A; 330/251
(58) Field of Search ............................... 330/10, 207 A, 330/251

(56) References Cited

U.S. PATENT DOCUMENTS 5,422,597 A * 6/1995 Stengel et al. ................ 330/10
5,438,694 A * 8/1995 Muri et al. ................... 330/10
6,281,767 B1 * 8/2001 Lastrucci ..................... 330/251
6,304,137 B1 * 10/2001 Pullen et al. ................. 330/10

* cited by examiner

*Primary Examiner*—Khanh Van Nguyen
(74) *Attorney, Agent, or Firm*—Gifford, Krass, Groh, Sprinkle, Anderson & Citkowski, PC

(57) ABSTRACT

A method and apparatus facilitate a voltage multiplication into the output stage of a switching amplifier. A plurality of switching devices are used to modulate the interconnection between a power supply, a reactance and a load in accordance with a modulation signal, such that the voltage across the load exceeds the supply voltage. In the situation where the reactance is a capacitor, the voltage across the load exceeds the supply voltage by two or an integer multiple thereof. In the preferred embodiment, a pair of reactances and attendant switching devices are used to modulate the interconnection between the supply voltage relative to both sides of the load depending upon the sign of the modulation signal.

7 Claims, 1 Drawing Sheet

SWITCHING AMPLIFIER WITH VOLTAGE-MULTIPLYING OUTPUT STAGE

REFERENCE TO RELATE APPLICATION

This application claims priority from U.S. provisional patent application Ser. No. 60/285,755, filed Apr. 23, 2001, the entire contents of which is incorporated herein by reference.

FIELD OF THE INVENTION

This invention relates generally to switching amplifiers and, in particular, to apparatus and methods for providing amplifier output voltages in excess of the available power supply.

BACKGROUND OF THE INVENTION

Typical switching amplifiers are comprised of multiple switching devices modulating connection between one or more power supplies and a load impedance. Resultantly, such circuit configurations are unable to provide voltages to the load in excess of that provided by the associated power supplies.

In limited-voltage situations, system losses often circumvent the use of low-impedance loads necessary to transfer large amounts of power. For such situations, there exists a need for a simple and inexpensive technique for providing amplifier output voltages in excess of the available power supply.

SUMMARY OF THE INVENTION

The present invention resides in a method and apparatus facilitating a voltage multiplication into the output stage of a switching amplifier. Broadly, a plurality of switching devices are used to modulate the interconnection between a power supply, a reactance and a load in accordance with a modulation signal, such that the voltage across the load exceeds the supply voltage. In the situation where the reactance is a capacitor, the voltage across the load exceeds the supply voltage by two or an integer multiple thereof.

In the preferred embodiment, a pair of reactances and attendant switching devices are used to modulate the interconnection between the supply voltage relative to both sides of the load depending upon the sign of the modulation signal.

DETAILED DESCRIPTION OF THE INVENTION

Figure 1:
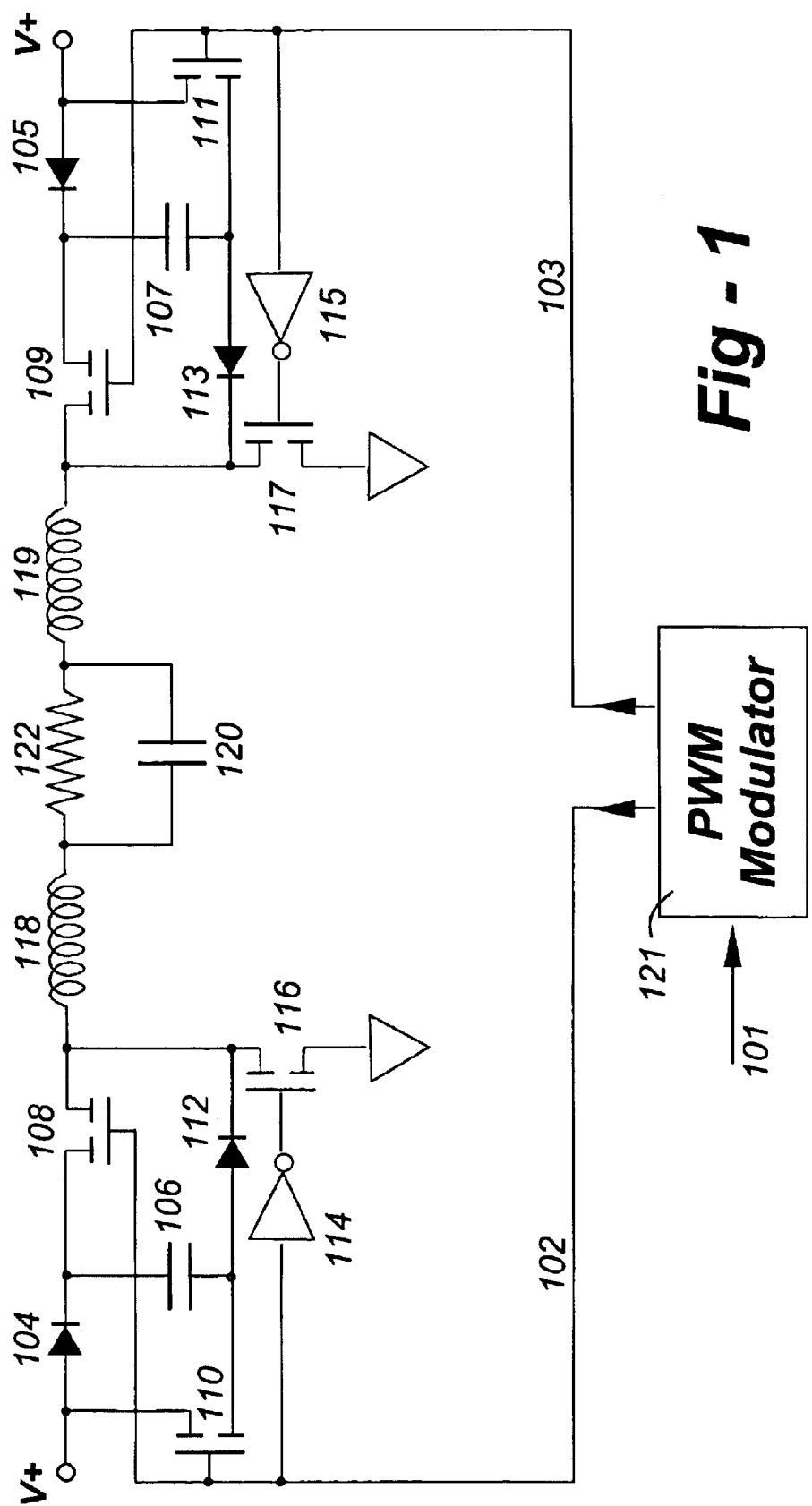
FIG. 1 is an electrical circuit diagram embodying a preferred embodiment of the invention.

FIG. 1 is an electrical circuit diagram embodying a preferred embodiment of the invention. Pulse-width modulator 121 receives as input a modulation signal 101, which may be analog or digital in nature. The function of pulse-width modulator 121 is to convert the modulation signal 101 into two control voltage pulse-width control voltages along paths 102 and 103, such that increasing absolute values of modulation signal 101 result in increased pulse widths on the signal lines 102 or 103, depending on the sign of modulation signal 101. It will be appreciated by those of skill in the art that numerous modulation schemes are possible, including amplitude, frequency, phase, and various combinations thereof. Likewise, various components and techniques are well known in the art for implementing the pulse-width modulation circuitry.

When control voltages 102 and 103 are not asserted, switching devices 110, 108, 111, and 109 are turned OFF, while inverters 114 and 115 ensure that switching devices 116 and 117, respectively, are turned ON. In this state, no potential difference exists across the series combination of inductor 118, load 122, and inductor 119, yielding no power into the load 122. Inductors 118 and 119, in conjunction with capacitor 120, serve to attenuate undesirable switching frequency components.

While control voltages 102 and 103 remain non-asserted, capacitors 106 and 107 are charged from the power supply V+ through diodes 104 and 105, respectively. The return paths for this charging current are formed by diodes 112 and 113, in conjunction with switching devices 116 and 117, respectively, which, as previously noted, are asserted in this state. It can therefore be seen that capacitors 106 and 107 will each be charged to within two diode drops of power supply V+ when control voltages 102 and 103 are not asserted.

When control voltage 102 is asserted, switching devices 110 and 108 are turned ON, while switching device 116 is turned OFF by the action of inverter 114. Switching device 110 then supplies power supply V+ to one terminal of capacitor 106, causing the other terminal of capacitor 106 to approach a voltage double the power supply. Switching device 108, being now turned ON, connects this doubled voltage to one terminal of inductor 118, which filters the voltage applied to one terminal of load 122. In the event that the second terminal of load 122 is at ground potential, under ultimate control of pulse-width modulator 121 in conjunction with switching device 117 via inverter 115, a voltage approaching double the power supply V+ will be exerted across the load 122.

In like, switching devices 111 and 109, using capacitor 107, apply a similar voltage to the second terminal of load 122 through inductor 119. If, at this time, the first terminal of load 122 is held at ground potential by switching device 116, under control of inverter 114 and pulse-width modulator 121, a voltage approaching double the power supply V+ will be exerted across the load 122 in an opposite direction to the case wherein control voltage 102 is asserted.

Thus, in accordance with the invention, a bi-directional current flow through load 122 experiences voltages approaching double the power supply V+. Although voltage doubling is described in this embodiment, it is understood that additional stages will result in other integer multiplications of the power supply voltage V+. Voltage tripling, quadrupling, etc., are therefore anticipated.

I claim:

1. A voltage-multiplying output stage for a switching amplifier coupled to at least one supply voltage, comprising:
   a load;
   a plurality of switching devices operative to modulate the interconnection between the supply and the load in accordance with a modulation signal; and
   a reactance associated with the switching devices enabling the voltage across the load to exceed the supply voltage.

2. The output stage of claim 1, wherein the reactance is a capacitor.

3. The output stage of claim 1, wherein the voltage across the load exceeds the supply voltage by an integer multiple of the supply voltage.

4. The output stage of claim 1, including:

a pair of reactances and attendant switching devices operative to modulate the interconnection between the supply voltage relative to both sides of the load depending upon the sign of the modulation signal.

5. A voltage-multiplying output stage for a switching amplifier interconnected to a supply voltage and a load having two sides, the output stage comprising:

an input for receiving a modulation signal having a sign;

a pulse-width modulator operative to convert the modulation signal into a pulse-width control signal characterized in that increasing absolute values of the modulation signal result in an increased pulse width of the control signal;

a capacitance; and a plurality of switching devices driven by the control signal to perform the following functions:

a) charge the capacitance to a level approaching the supply voltage when the control signal is not asserted, and b) add the voltage across the capacitance to the supply voltage when the control signal is asserted, thereby causing a voltage approaching double the supply voltage to be exerted across the load.

6. The output stage of claim 5, further including:

a pair of capacitances and attendant switching devices causing a voltage approaching double the supply voltage to be exerted across the load from either sides depending upon the sign of the modulation signal.

7. The output stage of claim 5, further including:

a plurality of capacitances and attendant switching devices such that the voltage across the load exceeds the supply voltage by an integer multiple.

\* \* \* \* \*